(12) United States Patent
Kasper et al.

(10) Patent No.: US 11,562,845 B2
(45) Date of Patent: Jan. 24, 2023

(54) INDUCTOR DEVICES AND IMPLEMENTATIONS

(71) Applicant: Infineon Technologies Austria AG, Villach (AT)

(72) Inventors: Matthias J. Kasper, Villach (AT); Kenneth K. Leong, Villach (AT); Luca Peluso, Villach (AT)

(73) Assignee: Infineon Technologies Austria AG, Villach (AT)

( * ) Notice: Subject to any disclaimer, the term of this patent is extended or adjusted under 35 U.S.C. 154(b) by 618 days.

(21) Appl. No.: 16/655,460

(22) Filed: Oct. 17, 2019

(65) Prior Publication Data

US 2021/0118604 A1    Apr. 22, 2021

(51) Int. Cl.
| | |
|---|---|
| *H05K 1/18* | (2006.01) |
| *H01F 27/28* | (2006.01) |
| *H01F 27/24* | (2006.01) |
| *H01F 27/40* | (2006.01) |
| *H01F 41/04* | (2006.01) |

(52) U.S. Cl.
CPC ............ *H01F 27/28* (2013.01); *H01F 27/24* (2013.01); *H01F 27/40* (2013.01); *H01F 41/04* (2013.01); *H05K 1/181* (2013.01); *H05K 2201/1003* (2013.01)

(58) Field of Classification Search
CPC .......... H01F 27/28; H01F 27/40; H01F 41/04; H01F 27/24; H05K 1/181; H05K 2201/1003; H05K 1/18
See application file for complete search history.

(56) References Cited

U.S. PATENT DOCUMENTS

| 7,119,648 B1 | 10/2006 | Herbert | |
|---|---|---|---|
| 2001/0052837 A1* | 12/2001 | Walsh | ............ H01F 19/04 336/174 |
| 2004/0150502 A1 | 8/2004 | Jacobson | |

FOREIGN PATENT DOCUMENTS

EP    1675139 A2    6/2006

OTHER PUBLICATIONS

International Search Report, PCT/EP2020/079095, dated Jan. 13, 2021, pp. 17.
Grzesik, et al., "Coaxial HF Power Transformner with Tubular Linear Windings—FEM Results vs. Laboratory Test", The Silesian University of Technology, Gliwice, Poland, 2006 IEEE, pp. 1313-1317.

* cited by examiner

*Primary Examiner* — Robert L Deberadinis
(74) *Attorney, Agent, or Firm* — Armis IP Law, LLC

(57) ABSTRACT

According to one configuration, an inductor device includes a first electrically conductive path; a second electrically conductive path, the first electrically conductive path electrically isolated from the second electrically conductive path; first material, the first material operative to space the first electrically conductive path with respect to the second electrically conductive path; and second material. The second material has a substantially higher magnetic permeability than the first material. An assembly of the first electrically conductive path, the second electrically conductive path, and the first material resides in a core of the second material.

42 Claims, 15 Drawing Sheets

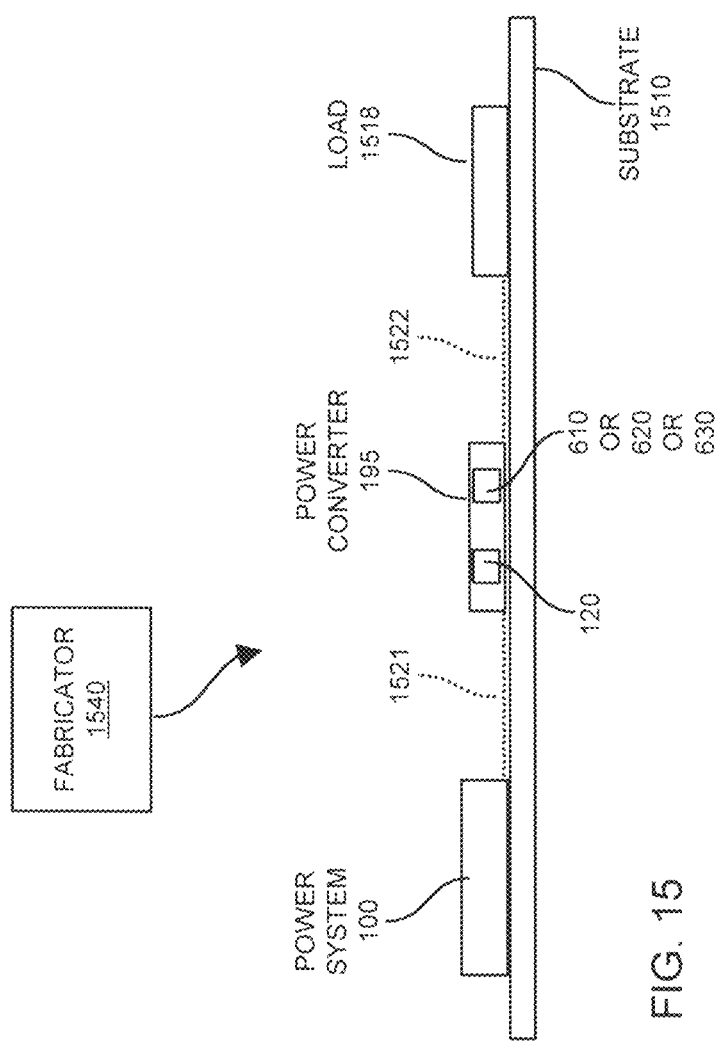

INDUCTOR DEVICES AND IMPLEMENTATIONS

BACKGROUND

Conventional switching power supply circuits sometimes include an energy storage component such as an inductor to produce an output voltage that powers a load. For example, to maintain a magnitude of an output voltage within a desired range, a controller controls switching of input current through one or more inductors.

In general, a conventional inductor is a component comprising wire or other conductive material, which is shaped as a coil or helix to increase an amount of magnetic flux through a respective circuit path. Winding a wire into a coil of multiple turns increases the number of respective magnetic flux lines in a respective inductor component, increasing the magnetic field and thus overall inductance of the respective inductor component.

In certain instances, conventional electronic devices include multiple magnetically coupled inductor devices known as transformers. Mutual inductance is where the magnetic flux of two or more inductors are coupled so that voltage is induced in one coil proportional to the rate-of-change of current in another. Thus, a transformer is a type of inductor device made of two or more inductors, and is driven via by varying current, which results in an AC voltage across the second inductor.

BRIEF DESCRIPTION

In contrast to conventional techniques, embodiments herein provide fabrication of novel and improved of inductor components.

For example, in one embodiment, a fabricator fabricates an inductor device (i.e., an electronic device including one or more inductors) to include a first electrically conductive path and a second electrically conductive path. Via first material (such as spacer or isolator material), the fabricator spaces the first electrically conductive path and the second electrically conductive path of the inductor device. The first material causes the first electrically conductive path to be electrically isolated from the second electrically conductive path in the inductor device. Additionally, the fabricator applies a second material to an assembly including the first electrically conductive path, second electrically conductive path, and the first material. In one embodiment, the second material has a substantially higher magnetic permeability than the first material. In such an instance, current flowing through the first electrically conductive path generates magnetic flux. A density of the generated magnetic flux in the second material is substantially higher than the density of magnetic flux in the first material.

In accordance with further embodiments, the flow of current through the first electrically conductive path and high density of magnetic flux in the second material causes a flow of current through the second electrically conductive path.

In accordance with still further embodiments, the fabricator of the inductor device fabricates the first electrically conductive path as a first tubular structure extending along an axial length of the inductor device from a first end of the inductor device to a second end of the inductor device; additionally, the fabricator fabricates the second electrically conductive path as a second tubular structure extending along the axial length of the inductor device from the first end to the second end.

Further embodiments herein include disposing the first tubular structure inside the second tubular structure. In one embodiment, the first material concentrically spaces the second tubular structure with respect to the first tubular structure. The fabricator disposes the second material to be external to the second tubular structure.

In one embodiment, the first material has a magnetic permeability of around 1. The second material has a magnetic permeability much greater than 1. In other words, in one embodiment, the first material has a substantially lower magnetic permeability than the second material.

In yet further embodiments, the higher permeability of the second material causes a magnetic flux density in the second material to be substantially greater than a magnetic flux density in the first material as caused by current flowing through the first electrically conductive path.

In yet further embodiments, the first electrically conductive path is a first portion of a split tubular structure extending along an axial length of the inductor device; and the second electrically conductive path is a second portion of the split tubular structure extending along the axial length of the inductor device. In such an instance, the first material resides in a volume between a cavity of the first portion of the tubular structure and a cavity of the second portion of the tubular structure. As previously discussed, the first material can be configured to have a substantially lower magnetic permeability than the second material.

In accordance with further embodiments, the tubular structure split into the first portion and second portion is a first tubular structure disposed in the inductor device. Embodiments herein further include fabricating the inductor device to include a third electrically conductive path, the third electrically conductive path being a second tubular structure extending along the axial length of the inductor device from the first end to the second end. In one embodiment, the third electrically conductive path (second tubular structure) is disposed between the first electrically conductive path and the second electrically conductive path.

In yet further example embodiments, the fabricator fabricates a layer of third material over the second material. A magnetic permeability of the third material is greater than the permeability of the second material. As previously discussed, the magnetic permeability of the second material is substantially greater than the magnetic permeability of the first material.

Yet further embodiments herein include disposing, via the fabricator, the second material to extend for a first distance along an axial length of the inductor device; and disposing the third material to extend for a second distance along the axial length of the inductor device, the second distance being less than the first distance. Variations in the distance controls parameters (such as a magnetic inductance) of the inductor device.

In accordance with further embodiments, the fabricator fabricates the inductor device to include a third electrically conductive path; the third electrically conductive path encompasses or surrounds an assembly including the first electrically conductive path, the second electrically conductive path, the first material, and the second material.

These and other more specific embodiments are disclosed in more detail below, which include a method of designing a new type of coaxial power transformers with ideal behavior, i.e. virtually zero leakage inductance, no air-gaps, and low magnetizing inductance value, which are required in high frequency applications. These applications include adapters, where the market introduction of wide-bandgap devices has pushed the switching frequency to ever higher levels. In this application, the popular flyback topology suffers the drawback of dissipating the energy stored in the leakage inductance in every switching cycle, which prohibits to fully exploit the high frequency capabilities of GaN switches. At the same time, when increasing the switching frequency, this application demands very low magnetizing inductance values in order to enable the power transfers at those frequencies. Low magnetizing inductance are traditionally achieved via air-gaps which cause flux leakage. Additionally, the requirements for EMI (Electro-Magnetic Interference) compliance demand a fully encapsulated magnetic core design (i.e. shielded) without any air-gaps to prevent any magnetic field from coupling into the EMI filter. The proposed transformer/inductor device as described herein provides all of the above mentioned features among others.

Note that any of the resources (such as a fabricator) implemented in system as discussed herein can include one or more computerized devices, controllers, mobile communication devices, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment herein includes a fabricator such as including computer readable storage medium and/or system having instructions stored thereon to fabricate an inductor device. The instructions, when executed by computer processor hardware, cause the computer processor hardware (such as one or more co-located or disparately located processor devices or hardware) to: fabricate an inductor device to include a first electrically conductive path and a second electrically conductive path; space the first electrically conductive path and the second electrically conductive path of the inductor device via first material, the first electrically conductive path electrically isolated from the second electrically conductive path; and fabricate a second material to encompass (surround, envelope, etc.) an assembly including a combination of the first electrically conductive path, second electrically conductive path, and the first material.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 15 is an example diagram illustrating a circuit assembly including one or more inductor devices according to embodiments herein.

Figure 1:
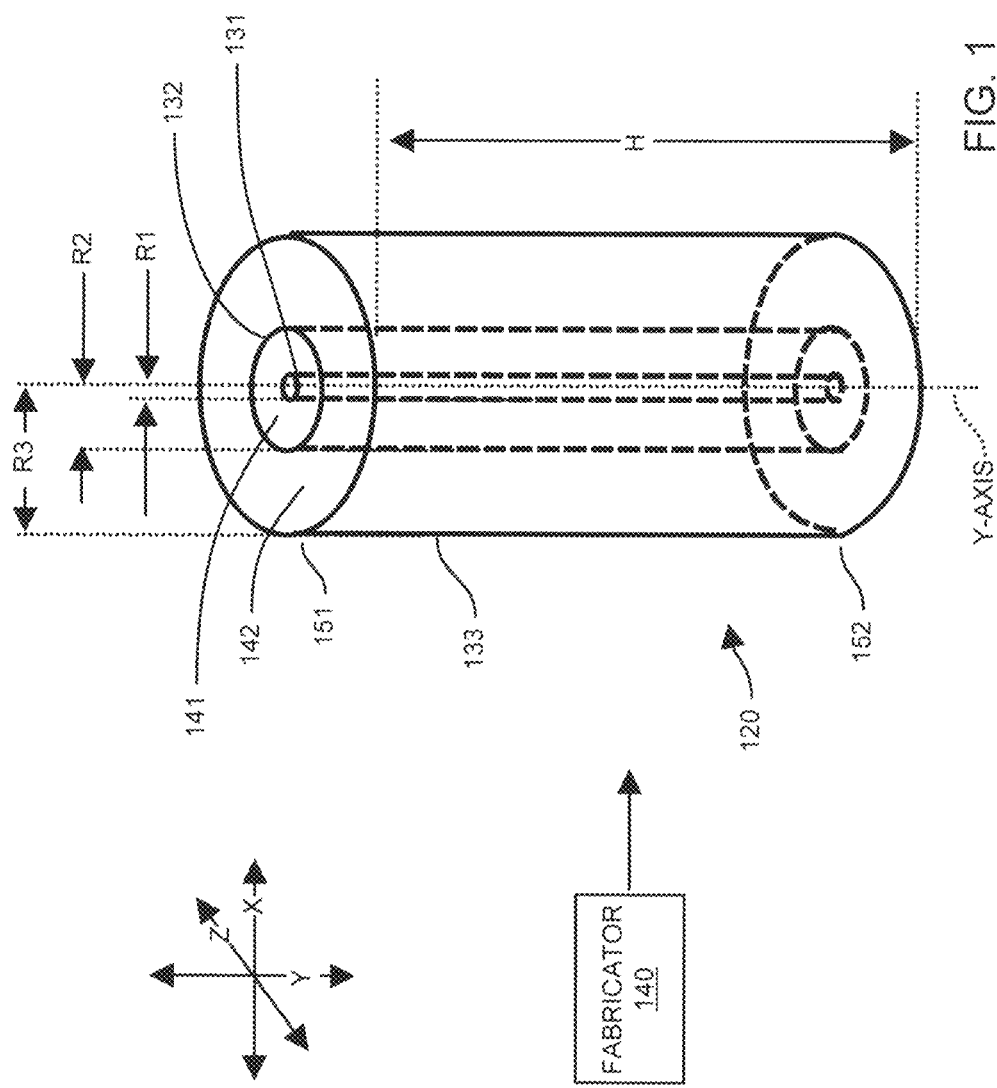
FIG. 1 is an example diagram illustrating an inductor device according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one configuration, an inductor device includes a first electrically conductive path and a second electrically conductive path. Via spacer material, the first electrically conductive path electrically is isolated and spaced from the second electrically conductive path. Second material surrounds the second electrically conductive path. For example, an assembly of the first electrically conductive path, the second electrically conductive path, and the first material resides in a core of the second material.

In one embodiment, the second material has a substantially higher magnetic permeability than the first material. The second material, which has the higher magnetic permeability, is operative to confine (guide, carry, convey, localize, etc.) respective magnetic flux generated from current flowing through a respective electrically conductive path in the inductor device. Thus, a magnetic flux density of magnetic flux produced by the current through the first electrically conductive path or second electrically conductive path is substantially greater in the second material than in the first material.

Now, with reference to the drawings, FIG. 1 is an example diagram illustrating an inductor device according to embodiments herein.

As shown in FIG. 1, a fabricator 140 fabricates an inductor device 120 to include a first electrically conductive path 131 (such as made from metal or other suitable material) and a second electrically conductive path 132 (such as made from metal or other suitable metal).

The first electrically conductive path 131 and second electrically conductive path 132 can take any suitable shape.

In one embodiment, the inductor device 120 is substantially cylindrical. The first electrically conductive path 131 is a tube structure extending from a first end 151 of the inductor device 120 along the axial length (y-axis) of the inductor device 120 to the second end 152. The fabricator 140 fabricates the second electrically conductive path 132 as a second tubular structure extending along the axial length (along y-axis) of the inductor device 120 from the first end 151 to the second end 152.

In one embodiment, the first electrically conductive path 131 is disposed within the second electrically conductive path 132.

Via first material 141 (such as so-called spacer material or isolation material), the fabricator 140 provides and fills a spacing between the first electrically conductive path 131 and the second electrically conductive path 132. The first material 141 (such as having magnetic permeability of around 1 or other suitable value) causes the first electrically conductive path 141 to be electrically isolated from the second electrically conductive path 142 in the inductor device 120.

If desired, the core (hollowed center) of the inductor device 120 (such as electrically conductive path 131) can be filled with material such as first material 141. Alternatively, the core of the electrically conductive path 131 can be filled with air.

In accordance with further embodiments, the fabricator 140 disposes the first tubular structure (such as electrically conductive path 131) inside the second tubular structure (such as electrically conductive path 132).

In one embodiment, as previously discussed, the first material 141 concentrically spaces (from a cross-sectional view along the y-axis) the second tubular structure with respect to the first tubular structure (electrically conductive path 131).

In yet further embodiments, the fabricator 140 further disposes the second material 142 to be external to the second tubular structure (electrically conductive path 132). More specifically, as further shown, the fabricator 140 applies a second material 142 to the assembly including the first electrically conductive path 131, second electrically conductive path 132, and the first material 141.

Thus, the spacing between the outer surface of the electrically conductive path 131 and the inner surface of the electrically conductive path 132 is filled with material 141. The spacing between the outer surface of the electrically conductive path 132 and the inner surface of the electrically conductive path 133 is filled with material 142.

In one embodiment, the second material 142 has a substantially higher magnetic permeability, $\mu_r$, than the first material 141. For example, the magnetic permeability $\mu_r$ of the first material 141 can be a value such as around 1; the magnetic permeability $\mu_r$ of the second material 142 can be a value such as greater than 5 (such as in a range between 5 and 1500 or other suitable value outside of this range).

As further discussed herein, in one embodiment, current flow through the first electrically conductive path 131 from the first end 151 through the electrically conductive path 131 to the second end 152 produces magnetic flux (according to the right hand rule).

Because the magnetic permeability of the material 142 is substantially greater than the magnetic permeability of the material 141, a density of the magnetic flux (associated with the flowing current through the first electrically conductive path 131) in the material 142 is substantially higher than the density of the magnetic flux in the first material 141.

In one embodiment, the flow of current through the first electrically conductive path 131 and high density of magnetic flux in the second material 142 causes a flow of current through the second electrically conductive path 132.

Additionally, or alternatively, the flow of current through the second electrically conductive path 132 and the corresponding generated high density of magnetic flux in the second material 142 causes a flow of current through the first electrically conductive path 131.

Note that, as further discussed herein, the leakage inductance (Lk) associated with the inductor device 120 can be adjusted via setting of radius R1, R2, and R3 and selection of materials 141 and 142. Additionally, via settings of R1, R2, R3, and material selection (magnetic permeability), parameters of the inductor device 120 such as capacitance between electrically conductive path 131 and electrically conductive path 132, as well as magnetizing inductance can be adjusted. Further embodiments herein include designing a geometry of the first material 141 to control a parasitic inductance and capacitance between the first electrically conductive path 131 and the second electrically conductive path 132. Yet further embodiments herein include designing a geometry of the second material 142 to control a magnetizing inductance of the inductor device 120.

Thus, in general, the electrically conductive path 131 (such as akin to a primary transformer winding) in the inductor device 120 is enclosed in a coaxial manner by electrically conductive path 132 (such as akin to a second inductive or transformer winding). Spacer material 141 (such as isolation material) is disposed between the first electrically conductive path 131 and the second electrically conductive path 132.

In one embodiment, the inductor device 120 operates as a transformer device. For example, the second electrically conductive path 132 is magnetically coupled to the first electrically conductive path 131; the flow of current through the electrically conductive path 131 causes a flow of current through the second electrically conductive path 132. As previously discussed, the electrically conductive path 132 (such as akin to a secondary winding) is surrounded by material 142 (such as core material).

In yet further embodiments, the first electrically conductive path 131 resides at radius R1 (such as 0.5 mm) from a central axis (Y-axis) of the inductor device 120; the second electrically conductive path 132 resides at radius R2 (such as 2 mm) from the central axis (Y-axis) of the inductor device 120; the third electrically conductive path 133 resides at radius R3 (such as 5 mm) from a central axis (Y-axis) of the inductor device 120.

Note further that the inductor device 120 can be configured to include an outside layer of metal material (electrically conductive path 133) in contact with an outer surface of the magnetically permeable material 142. The third electrically conductive path 133 encompasses or surrounds an assembly including the first electrically conductive path 131, the second electrically conductive path 132, the first material 141, and the second material 142. If desired, the electrically conductive path 133 (such as an external shield fabricated from a layer of metal, which may be tubular in shape) can be attached to a secondary or primary side ground, depending on the needs of the application.

Figure 2:
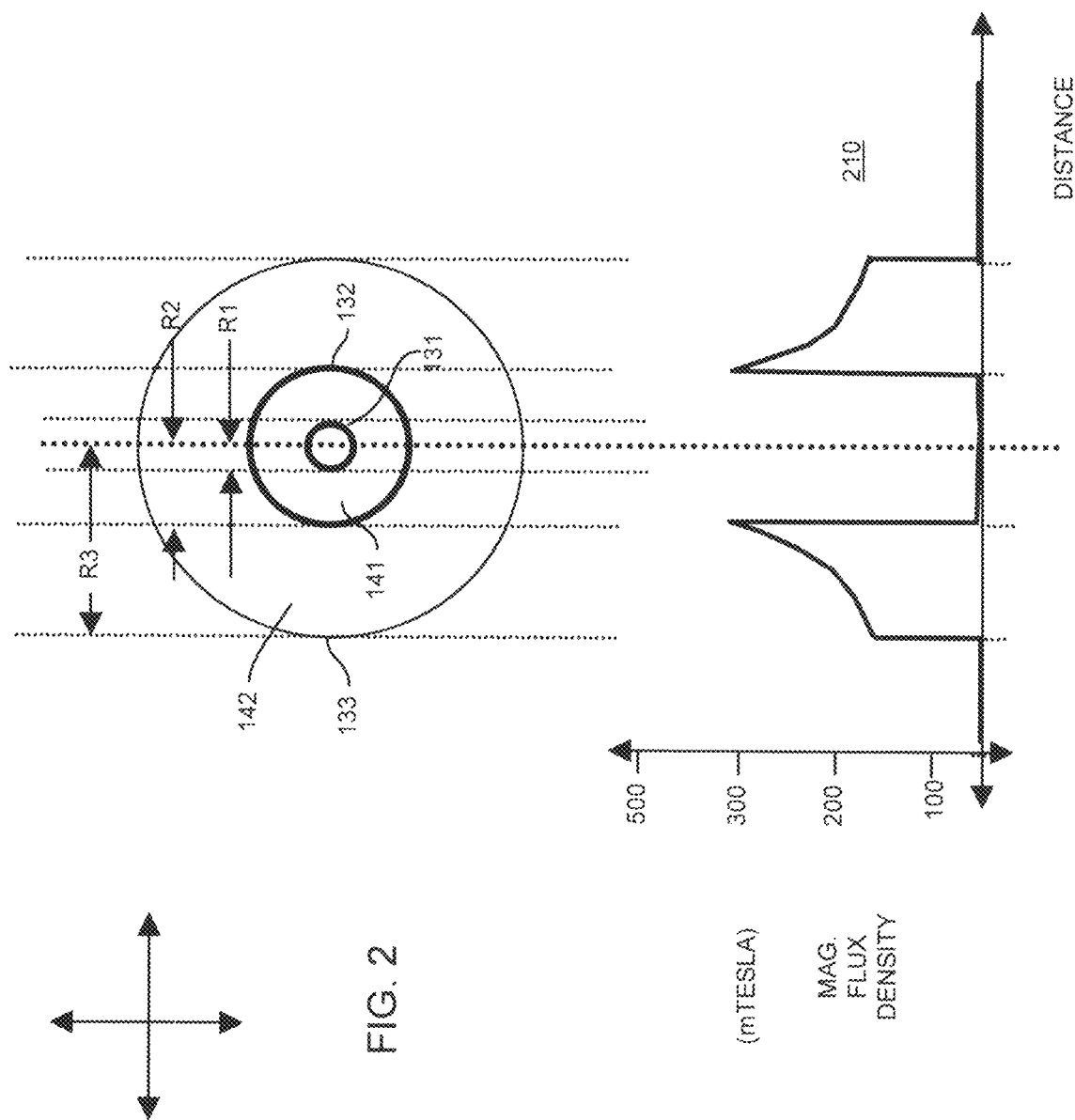
FIG. 2 is an example diagram illustrating a cross-sectional view of inductor device and corresponding magnetic flux density according to embodiments herein.

FIG. 2 is an example diagram illustrating a cross-sectional view (viewed along the y-axis) of inductor device and corresponding magnetic flux density according to embodiments herein.

Control of Leakage Inductance Associated with Inductor Device—

In one embodiment, as previously discussed, the inductor device 120 and corresponding one or more components are cylindrical (tube-like), implementation of which has several design degrees of freedom such as:

i) The radial distance between the electrically conductive path 132 and electrically conductive path 131 (such as R2−R1) can be used to adjust the leakage inductance (Lk) of the magnetically coupled inductor device 120. For example, by increasing the radial separation between the second electrically conductive path 132 and the first electrically conductive path 131, the leakage inductance Lk also increases because inductive coupling between the first electrically conductive path 131 and second electrically conductive path 132 is reduced. Note that certain embodiments herein include providing low leakage (Lk) via an inductor device 120 having no air gaps.

ii) Another parameter for adjusting the leakage inductance Lk associated with the inductor device 120 (such as a transformer) is the choice of isolation material 141 present in the inductor device 120 between the electrically conductive path 131 and the electrically conductive path 132. As previously discussed, the magnitude of the magnetic permeability of the isolation material 132 influences the leakage in such a way that increasing the magnetic permeability of material 132 increases the leakage, Lk, associated with the inductor device 120. This is due to the fact that the magnetic flux induced by the electrically conductive path 131 (primary) in the isolation material 141 is not linked with the electrically conductive path 132 (secondary). Here, assuming the isolation material 131 is a material such as plastic, the leakage inductance is 10 nH seen from the primary (electrically conductive path 131). By increasing the radius of the electrically conductive path 131 (inner primary) from 0.5 mm (millimeters) to 0.8 mm while keeping everything else the same, we reduce the leakage Lk associated with the inductor device 120 to 7.16 nH.

In one embodiment, in order to decrease the leakage to a bare physical minimum, the position of the primary electrically conductive path 131 and the secondary electrically conductive path 132 can be interchanged, such that the secondary electrically conductive path 132 is inside the primary electrically conductive path 131. More specifically, in one embodiment, the electrically conductive path 131 is akin to a secondary winding, while the electrically conductive path 132 is akin to the primary winding of a respective transformer. In such an instance, all of the flux created by current through the primary winding (such as current passing through the electrically conductive path 132) is coupled into the secondary winding (electrically conductive path 131) and thus theoretically no leakage occurs. According to FEM (finite Element Method) simulations, with the same physical dimensions of the inductor device 120 as in FIG. 1, the leakage inductance is reduced to 138 pH (virtually zero), and thus negligible in real applications.

Control of Magnetizing Inductance Associated with Inductor Device—

Based on FEM simulation, an inductor device 120 in FIG. 1 is simulated with the dimensions displayed in FIG. 1. In this example embodiment, the core material 142 has a magnetic permeability (much greater than 1) of $\mu_r=1100$ (such as ML95S by Hitachi™), while the isolation material 141 has a magnetic permeability of around $\mu_r=1$. Thus, the first material 141 has a substantially lower magnetic permeability than the second material 142.

In such an instance, the higher magnetic permeability of the second material 142 causes a magnetic flux density in the second material 142 to be substantially greater than a magnetic flux density in the first material as caused by current flowing through the first electrically conductive path. See graph 210.

In one embodiment, the thickness of each electrically conductive path is set to 200 um (micrometers), although the thickness can be any suitable value. As a result, in this example embodiment, the primary and secondary side magnetizing inductance (Lm) associated with the inductor device 120 is 7.2 uH. The flux density inside the core material 142 is shown in graph 210 of FIG. 2 based on a peak current of 4 Amperes through the electrically conductive path 131 and well below the saturation limit of 430 mT (milliTesla). Based on a formula of calculating the inductance (L) of a magnetic structure, the magnetizing inductance Lm of the inductor device 120 is inversely proportional to the magnetic reluctance Rm:

$$Lm = A_l \cdot N^2 = \frac{1}{R_m} \cdot N^2$$

The reluctance of the inductor device 120 can be varied by different methods, e.g., by changing the permeability of the core material 142, by varying the height (H) of the inductor device 120 from the first end 151 to the second end 152, or by varying the width of (or radius associated with) the core material 142, and so on.

For example, increasing the height (H) of the inductor device 120 in general decreases the reluctance and therefore increases the magnetizing inductance (Lm) of the inductor device 120.

As further discussed herein, use of the spacer material 141, and providing of corresponding spacing (via spacer material 141) between the first electrically conductive path 131 and the second electrically conductive path 132 enables the control of a respective capacitance between the first electrically conductive path 131 and the second electrically conductive path 132.

Figure 3:
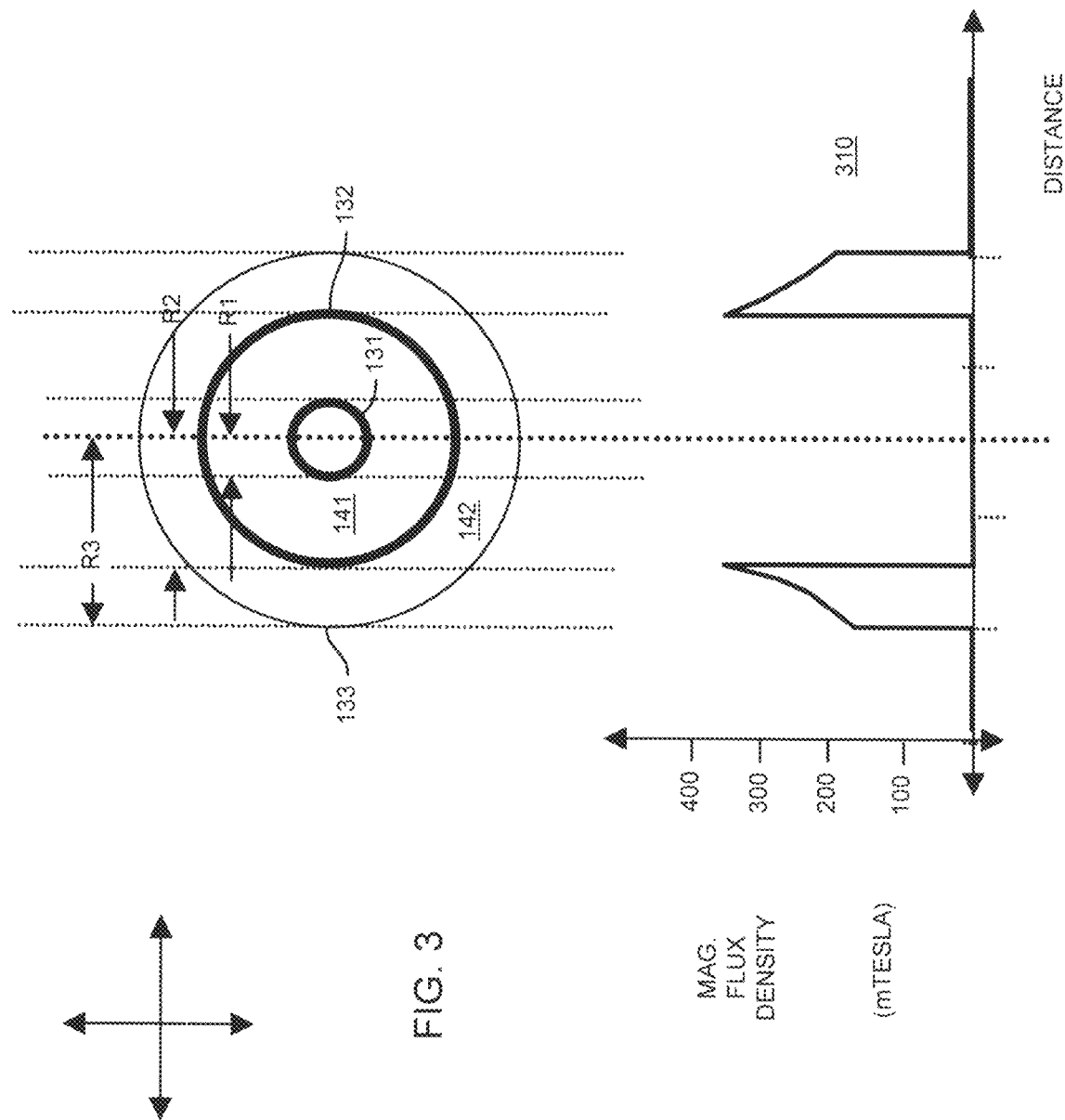
FIG. 3 is an example diagram illustrating a cross-sectional view of inductor device and corresponding magnetic flux density according to embodiments herein.

FIG. 3 is an example diagram illustrating a cross-sectional view of inductor device and corresponding magnetic flux density according to embodiments herein.

Controllable of Inter-Winding Capacitance—

In an alternative design of inductor device 120, where the target magnetizing inductance Lm of the inductor device 140 is 2 µH (micro-Henries), the dimension of the inductor device 120 can be changed to R1=0.5 mm, R2=2 mm, R3=3 mm and h=30 mm (in reference to FIG. 3) to achieve a desired Lm value.

With the primary (electrically conductive path 132) as the outer ring of the inductor device 120, the leakage inductance is 107 pH (pico-Henries), which is virtually zero inductance. In such a design (FIG. 3) with a circular gap of 1.5 mm (such as R2−R1), the inter-winding capacitance between primary (electrically conductive path) and the secondary (electrically conductive path) is 3.58 pF, which is far below commercial state of the art adaptor inter-winding capacitance target in the range of 100 pF. This is useful since this would completely eliminate the touch current issue. The inter-winding capacitance (Cpara) associated with the combination of electrically conductive path 131 and electrically conductive path 132 of the inductor device 120 is calculated as follows:

$$C_{para} = \frac{2\pi\varepsilon_0\varepsilon_r h}{\ln\left(\frac{R_2}{R_1}\right)}$$

Based on this formula, it is shown how changing the geometry (such as R1, R2, height H, etc.) and/or properties of isolation material 141, material 142, etc., influences the inter-winding capacitance associated with the inductor device 120.

Figure 4:
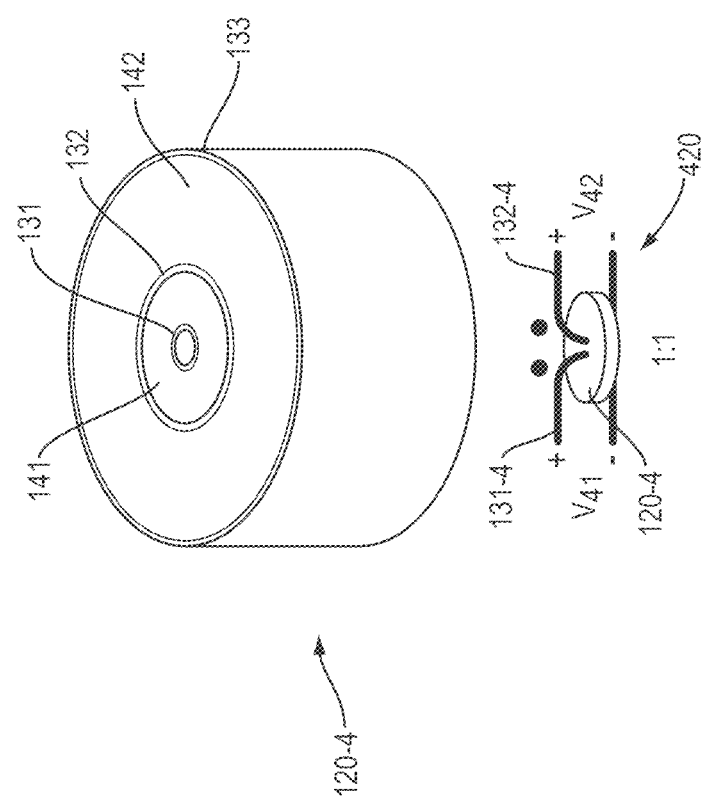
FIG. 4 is an example diagram illustrating an inductor device implemented as a transformer according to embodiments herein.

FIG. 4 is an example diagram illustrating an inductor device implemented as a transformer according to embodiments herein.

In this example embodiment, the inductor device 120 is implemented in a respective circuit 420. The inductor device 120 converts input voltage (V41) to the output voltage (V42) based on a ratio of 1:1 provided by the inductor device 120.

Figure 5:
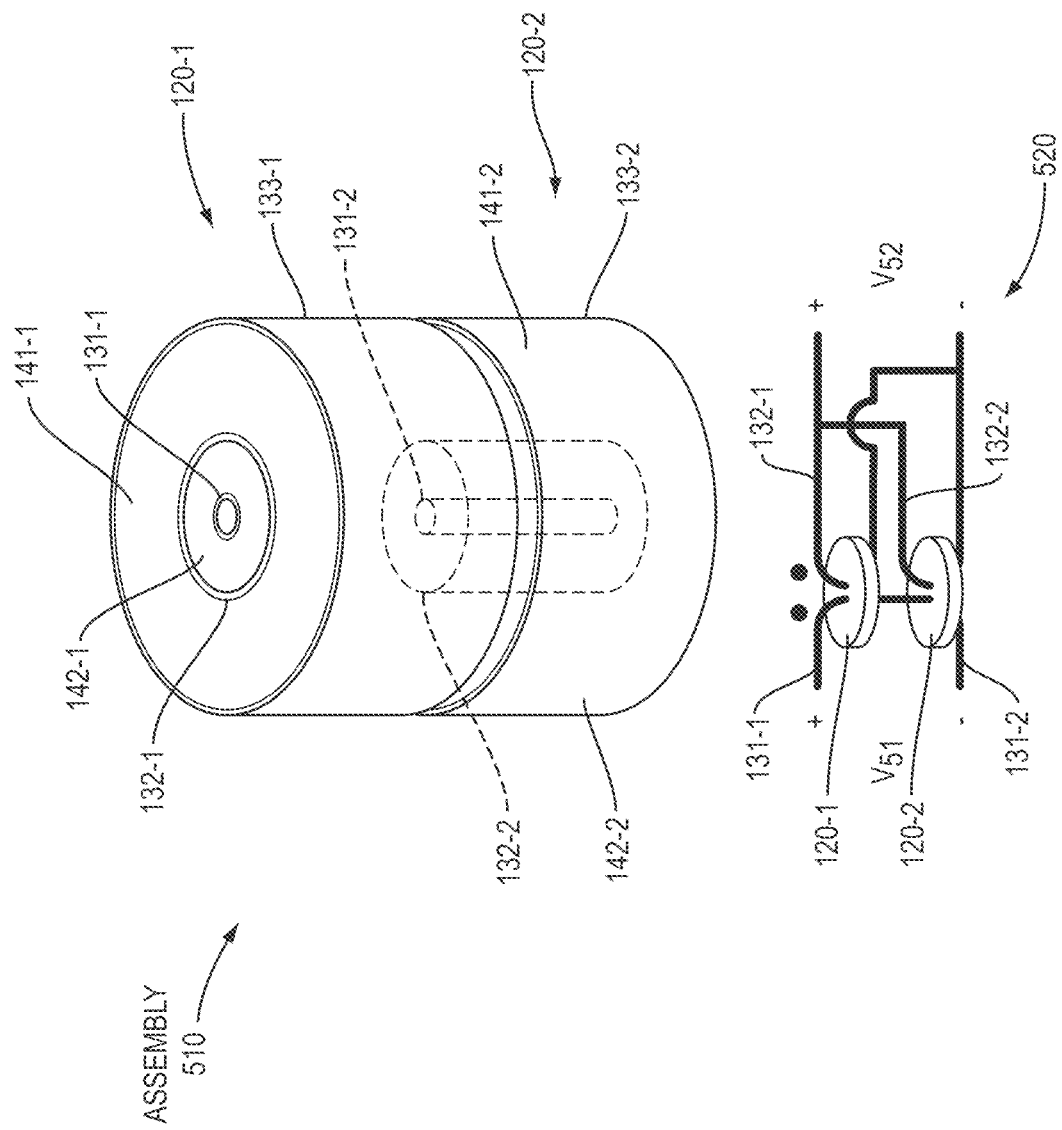
FIG. 5 is an example diagram illustrating an inductor device fabricated in a transformer circuit according to embodiments herein.

FIG. 5 is an example diagram illustrating an inductor device fabricated in a transformer circuit according to embodiments herein.

Note that all of the above mentioned inductor device 120 designs provide a 1:1 turn ratio.

In order to achieve turn ratios other than 1:1, multiple inductor devices 120 can be arranged in a respective matrix assembly 510 as shown in FIG. 5. This means, for example, that the primary side terminals (electrically conductive paths 131-1 and 131-2) of two respective inductor devices 120-1 and 120-2 can be connected in series as shown in FIG. 5, while the secondary side terminals (electrically conductive paths 132-1 and 132-2) can be connected in parallel as also shown in FIG. 5.

Such an embodiment allows a design to provide conversion ratios of integral numbers N, i.e., N:1 or 1:N (where N=2 in this case).

In such an instance, based on a 2:1 ratio associated with the assembly 510 and corresponding circuit 520, the output voltage V52 is half the input voltage V51.

In one embodiment, as shown, note that it is beneficial to place the winding (such as combination of electrically conductive path 131-1 and electrically conductive path 131-2) which is series connected inside the winding (such as electrically conductive path 132-1 and 132-2), whose output is connected in parallel. This facilitates easier access to the parallel connected windings (132-1 and 132-2), because they are the outside tubular structures associated with electrically conductive paths 131-1 and 131-2.

Figure 6:
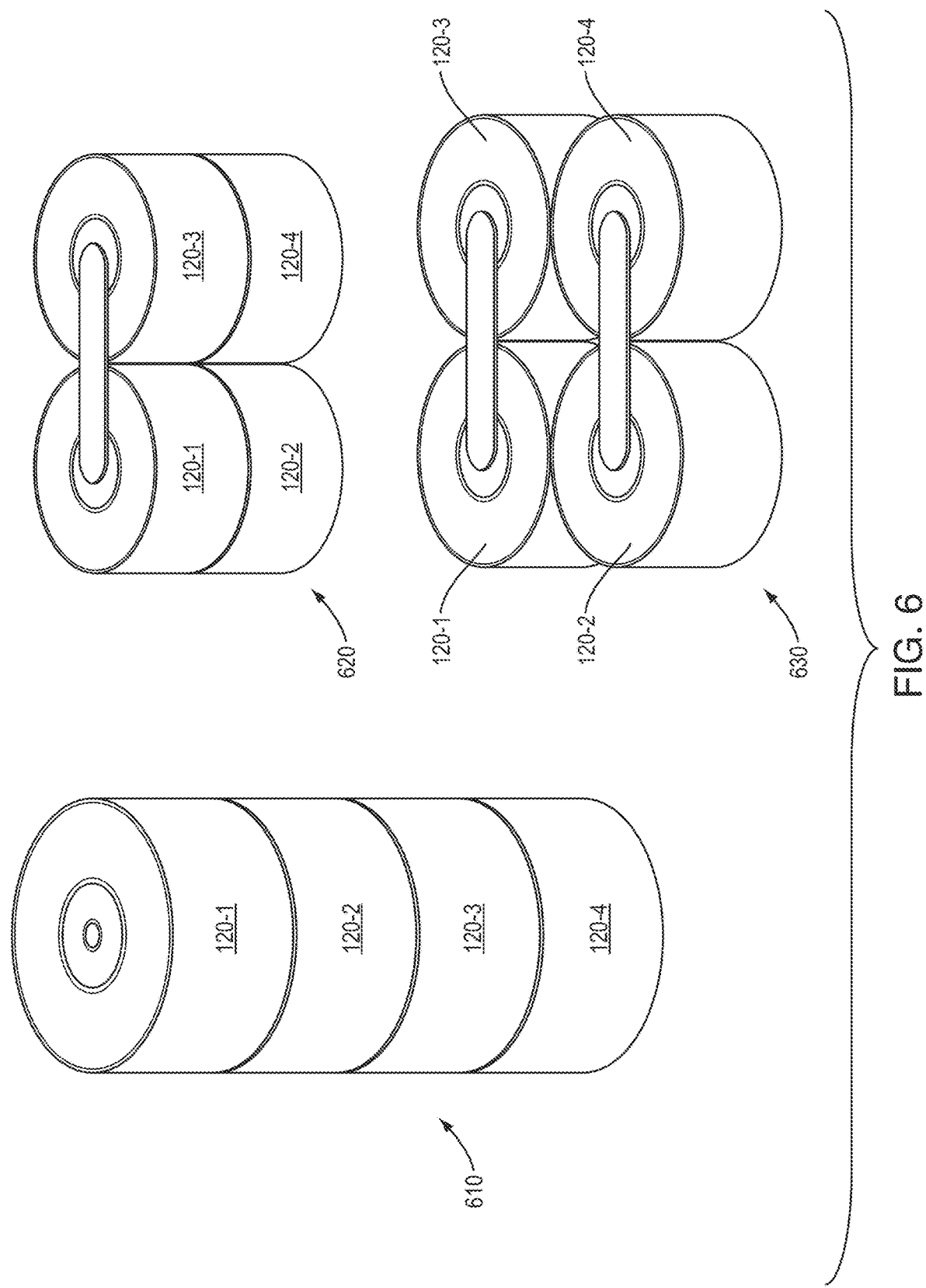
FIG. 6 is an example diagram illustrating different implementations of an inductor assemblies including multiple inductor devices according to embodiments herein.

FIG. 6 is an example diagram illustrating different implementations of an inductor device according to embodiments herein.

When implemented as a matrix arrangement of inductor device assemblies, the respective inductor assemblies do not necessarily have to be stacked as shown via assembly 610 (such as including inductor device 120-1, inductor device 120-2, inductor device, 120-3, and inductor device 120-4).

For example, the instances of inductor devices 120 (such as including inductor device 120-1, inductor device 120-2, inductor device, 120-3, and inductor device 120-4) in FIG. 6 can be disposed next to each other either in small connected stacks (such as illustrated via assembly 620) either in smaller stacks (stack including inductor device 120-1 and 120-2, stack including inductor device 120-3 and 120-4) or connected individually as shown by assembly 630.

Thus, any of multiple instances of inductor devices 120 can be connected in parallel, series, or combination of series and parallel. This allow use of the inductor devices and corresponding assembly of multiple inductor devices in space or height limited applications such as ultra-flat adapters.

Figure 7:
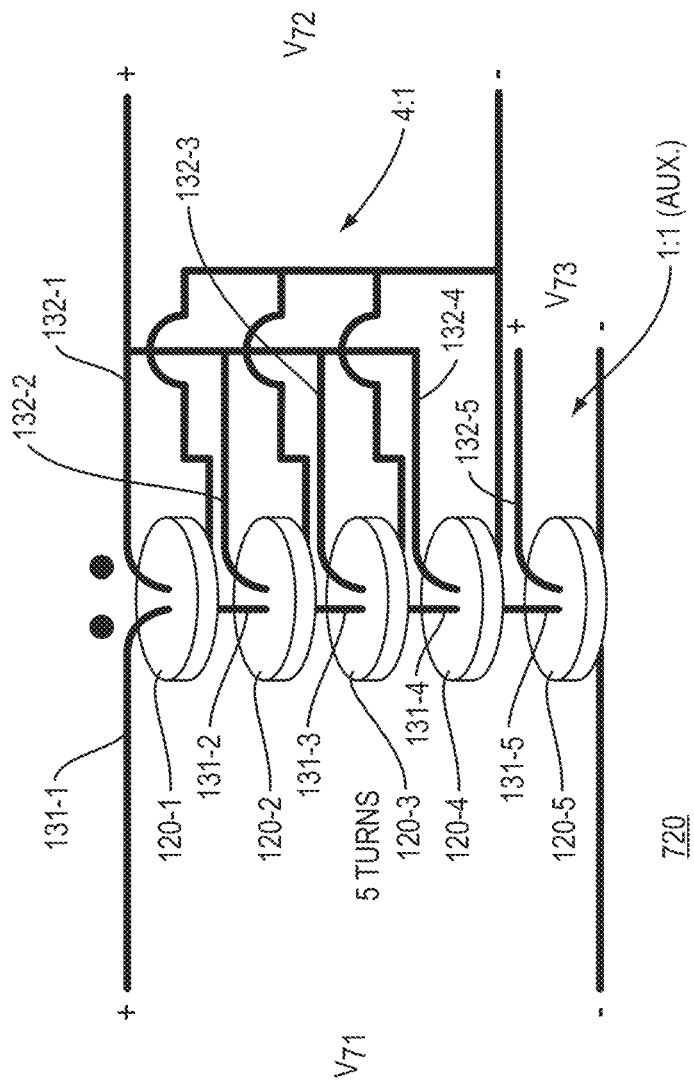
FIG. 7 is an example diagram illustrating implementation of multiple inductor devices according to embodiments herein.

FIG. 7 is an example diagram illustrating implementation of multiple inductor devices according to embodiments herein.

Assume in this example embodiment, the inductor devices in the assembly 720 support a high frequency flyback adapter application in which current inputted to the assembly 720 produces respective output current.

In general, the assembly 720 utilizes five inductor devices (inductor devices 120-1, 120-2, 120-3, 120-4, and 120-5), each individually providing a 1:1 conversion ratio. As shown, 4 inductor devices 120 (namely, inductor device 120-1, inductor device 120-2, inductor device 120-3, and inductor device 120-4) are connected as a 4:1 step-down ratio of converting an input voltage (V1) such as 5V into an output voltage (V2) of 1V. Inductor device 120-5 (such as an auxiliary winding) produces a separate output voltage V3 to power control electronics or other circuitry.

In such an instance, the assembly 720 features a very low leakage inductance and low magnetizing inductance and is therefore well-suited suited for use in high-frequency flyback converters.

Figure 8:
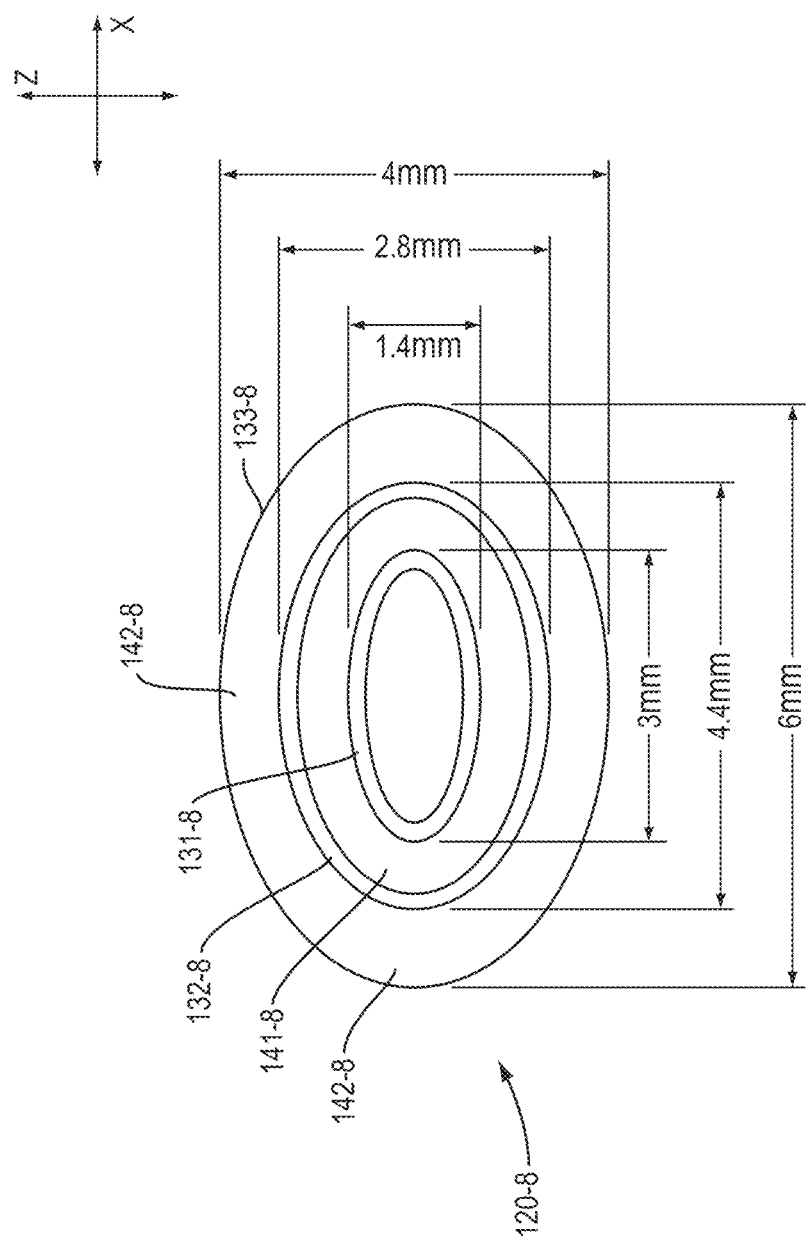
FIG. 8 is an example diagram illustrating a cross-sectional view of an elliptical inductor device according to embodiments herein.

FIG. 8 is an example diagram illustrating a cross-sectional view of an elliptical inductor device and corresponding magnetic flux density according to embodiments herein.

Note that the inductor device can be configured into any suitable geometry. As shown in FIG. 8, the shape and corresponding cross-sectional view of the inductor device 120 as viewed along axis Y (orthogonal to the page) can be elliptical.

In this example embodiment, the inductor device 120-8 is substantially elliptical. The first electrically conductive path 131-8 is a tube structure extending from a first end 151 of the inductor device 120-8 along the axial length (y-axis) of the inductor device 120-8 to the second end 152. The fabricator 140 fabricates the second electrically conductive path 132-8 as a second tubular structure extending along the axial length (along y-axis) of the inductor device 120-8.

In one embodiment, as shown in FIG. 8, the first electrically conductive path 131-8 is disposed within the second electrically conductive path 132-8.

Via first material 141-8 (such as so-called spacer material or isolation material), the fabricator 140 provides and fills a spacing between the first electrically conductive path 131-8 and the second electrically conductive path 132-8. The first material 141-8 (such as having magnetic permeability of around 1 or other suitable value) causes the first electrically conductive path 141-8 to be electrically isolated from the second electrically conductive path 142-8 in the inductor device 120-8.

Material 142-8 fills a spacing between the electrically conductive path 132-8 and the electrically conductive path 133-8.

If desired, the core (hollowed center) of the inductor device 120-8 (such as electrically conductive path 131-8) can be filled with material such as first material 141-8. Alternatively, the core or center of the electrically conductive path 131-8 can be filled with air.

In this example embodiment, the oval shaped inductor device 120-8 has a magnetizing inductance of Lm=2 µH. In such an instance, the leakage inductance (Lk) associated with the inductor device 120-8 is 3.16 nH assuming electrically conductive path 131-8 is the primary winding, which resides within electrically conductive path 132-8, and the inter-winding capacitance is 10 pF. Note that further embodiments herein include a so-called stadium geometry and elongated stadium shapes, which have an effect of lowering Lm and increasing respective the inter-winding capacitance.

Figure 9:
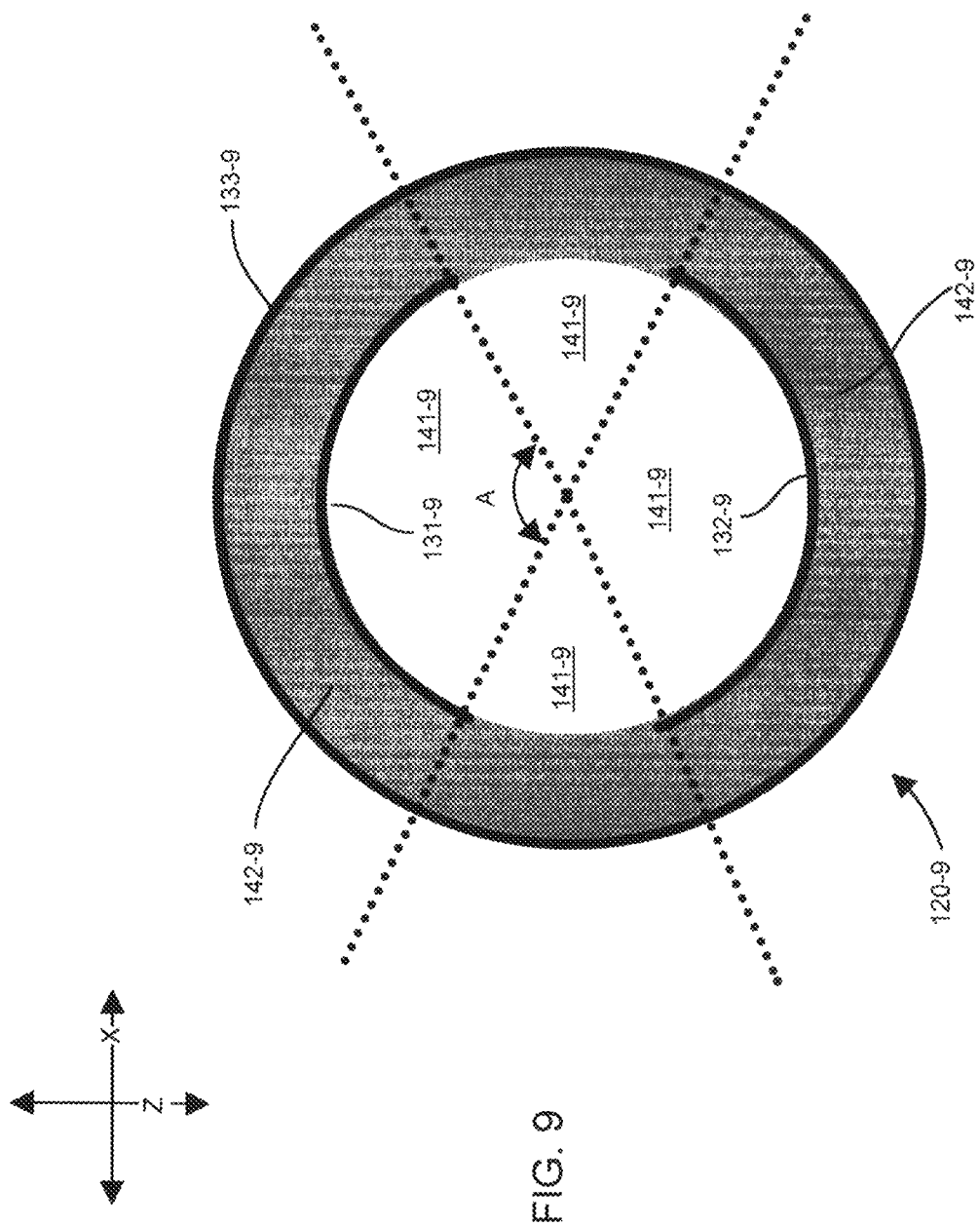
FIG. 9 is an example diagram illustrating a cross-sectional view of an inductor device according to embodiments herein.

FIG. 9 is an example diagram illustrating a cross-sectional view of an inductor device according to embodiments herein.

In accordance with further embodiments, the inductor device 120-9 as shown in FIG. 9 can be configured to include a split ring tubular structure in which a respective primary electrically conductive path and secondary electrically conductive path lay in the same circle (cross-sectional view), but are split into two (or more) parts (such as arcs of any angle A).

More specifically, in this example embodiment, the first electrically conductive path 131-9 is a first portion of a split tubular structure extending along an axial length (along y-axis orthogonal to the page) of the inductor device 120-9; the second electrically conductive path 132-9 is a second portion of the split tubular structure extending along the axial length (along y-axis orthogonal to the page) of the inductor device 120-9.

The electrically conductive path 131-9 is electrically isolated from the electrically conductive path 132-9 via material 141-9. In this example embodiment, the first material 141-9 (such as having a magnetic permeability of $\mu_r=1$) resides in a volume between a cavity of the first portion of the split tubular structure (electrically conductive path 131-9) and a cavity of the second portion of the split tubular structure (electrically conductive path 132-9). As previously discussed, the first material 141-9 can be configured to have a substantially lower magnetic permeability than the second material 142-9 (such as having a magnetic permeability greater than 50).

One example of a split ring concept with Lm=2 µH, winding radius associated with the electrically conductive paths 131-9 and 132-9 is 2 mm and the core radius is 3 mm. In such an instance, the inter-winding capacitance associated with the electrically conductive paths can become even lower compared to FIG. 3 at 2.64 pF. This arrangement is also beneficial if easier access to the windings is required.

Figure 10:
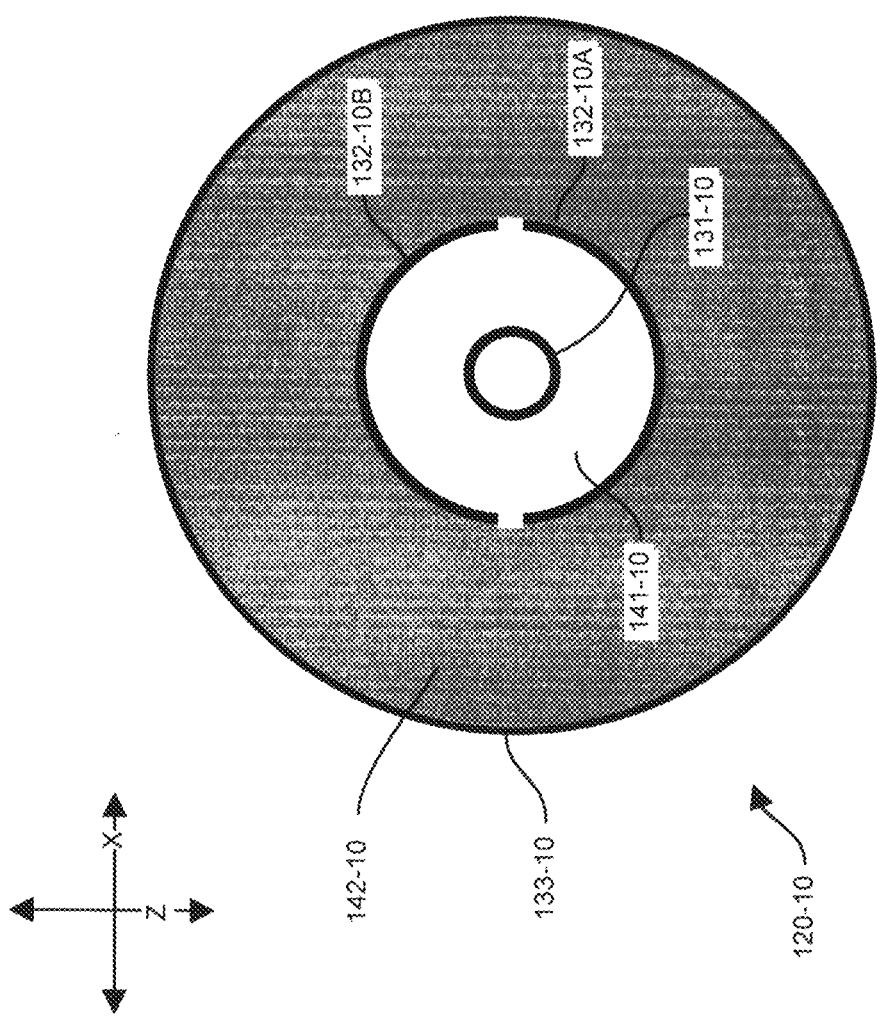
FIG. 10 is an example diagram illustrating a cross-sectional view of an inductor device according to embodiments herein.

FIG. 10 is an example diagram illustrating a cross-sectional view of an inductor device according to embodiments herein.

In another embodiment, in which the primary electrically conductive path resides inside the secondary electrically conductive path, the secondary electrically conductive path is split into two half rings, as shown in the inductor device 120-10. This results in a center-tapped transformer, as often used in high current applications for reduced synchronous rectifier losses. In one embodiment, only one secondary half-ring is conducting current at any time. The values of leakage inductances stay essentially the same as in the case of a single secondary ring.

Note that the two sections of the split ring (electrically conductive path 132-10A and 132-10B) do not have to belong to the same terminals of the inductor device 120-10. It could also be the case that one section of the split ring belongs, for example, to an auxiliary winding with different split ratio of a circle. Someone skilled in the art can easily derive more combinations of split rings and enclosed windings which are not mentioned here.

More specifically, in this example embodiment, the split tubular structure disposed in inductor device 120-10 includes a first portion (such as electrically conductive path 132-10A) and second portion (electrically conductive path 132-10B) is a first tubular structure (which is split) in the inductor device 120-10. Embodiments herein further include fabricating the inductor device 120-10 to include a third electrically conductive path 131-10 such as at a center of the first tubular structure.

In one embodiment, the third electrically conductive path 131-10 is a second tubular structure extending along the axial length (along y-axis) of the inductor device 120-10 from a first end of the inductor device 120-10 to a second end of the inductor device 120-10. The third electrically conductive path 131-10 (second tubular structure) is disposed between the first electrically conductive path 132-10A and the second electrically conductive path 132-10B.

Figure 11:
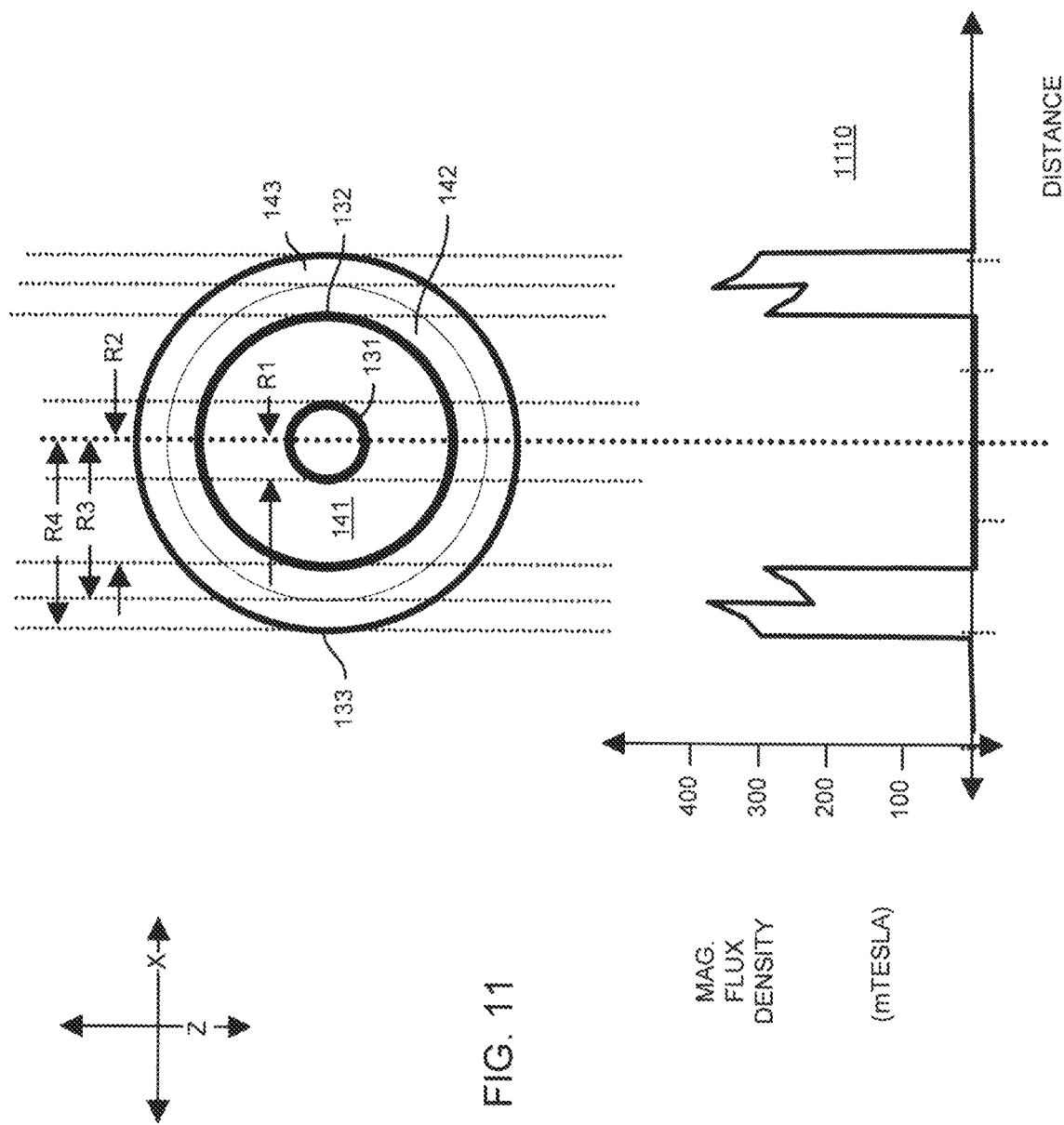
FIG. 11 is an example diagram illustrating a cross-sectional view of an inductor device and corresponding magnetic flux density according to embodiments herein.

FIG. 11 is an example diagram illustrating a cross-sectional view of an inductor device and corresponding magnetic flux density according to embodiments herein.

In yet further example embodiments, the fabricator 140 fabricates a layer of third material 143 over the second material 142. A magnetic permeability of the third material 143 is greater than the magnetic permeability of the second material 142.

As previously discussed, the magnetic permeability of the second material 142 is substantially greater (such as at least 10% greater) than the magnetic permeability of the first material 141. The magnetic permeability of the third material 143 is substantially greater (such as at least 10% greater) than the magnetic permeability of the second material 142.

In one embodiment, the material 141 has a magnetic permeability of $\mu_r=1$; the material 142 has a magnetic permeability of $\mu_r=1100$; the material 143 has a magnetic permeability of $\mu_r=1500$. Note that these values are proposed for illustrative purposes only; the magnetic permeability of the materials can be any suitable values.

In the example case in FIG. 11, the Lm of the inductor device 120-11 increases from 2 µH (for the single outer magnetic permeable layer in FIG. 1) to 2.4 µH (for the multiple outer magnetic permeable layers in FIG. 11). Note further that, as shown in graph 1110, the maximum flux is no longer concentrated at the edge of the outer winding (outer surface of electrically conductive path 131-2) but in the material 143 of inductor device 120-11. Note that the inductor device 120-11 can be configured to include any number of layers of different magnetic permeable material outside of electrically conductive path 132.

Figure 12:
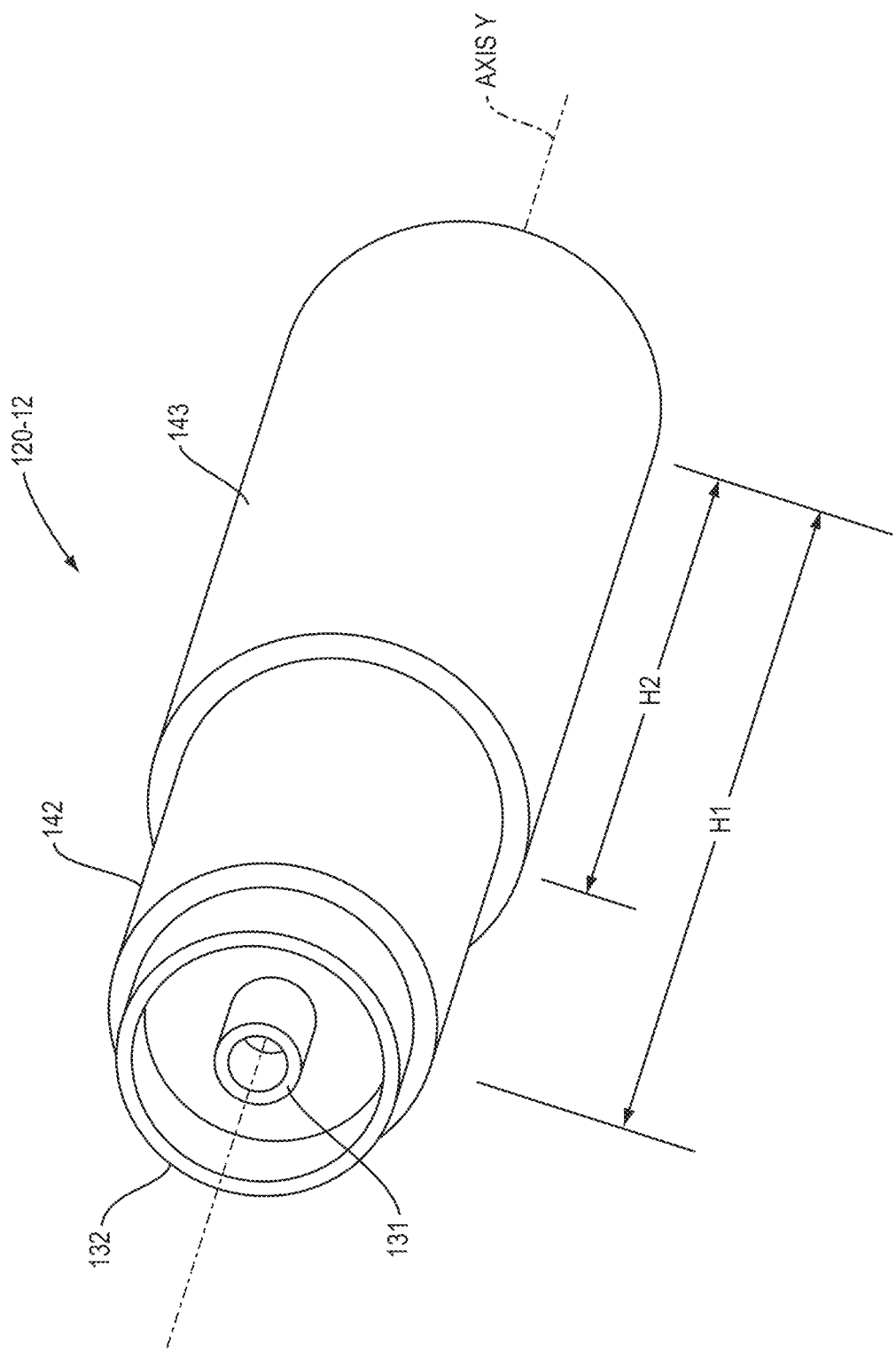
FIG. 12 is an example diagram illustrating a 3-D view of an inductor device according to embodiments herein.

FIG. 12 is an example diagram illustrating a 3-D view of an inductor device according to embodiments herein.

Furthermore, note that Lm can be modified with different heights of the two core geometries. For example, as shown in FIG. 12, one can reduce the height (distance) of the outer core (such as layer of material 143) from 30 mm to 20 mm and therefore reduce Lm from 2.4 µH to 1.7 µH, while keeping all other dimensions the same. One can therefore modify the required Lm by adding or removing small "units" of ring cores in the inductor device.

Accordingly, embodiments herein include disposing, via the fabricator 140, the second material 142 to extend for a first distance (H1) along an axial length (along axis Y) of the inductor device 120-12; and disposing the third material 143 to extend for a second distance (H2, where distance H2<H1) along the axial length of the inductor device 120-12; the second distance H2 being less than the first distance H1. Variations in the distances for H1 and H2, and variations in the magnetic permeability of the material 142 and 143, control parameters (such as a magnetic inductance) of the inductor device 120-12.

Figure 13:
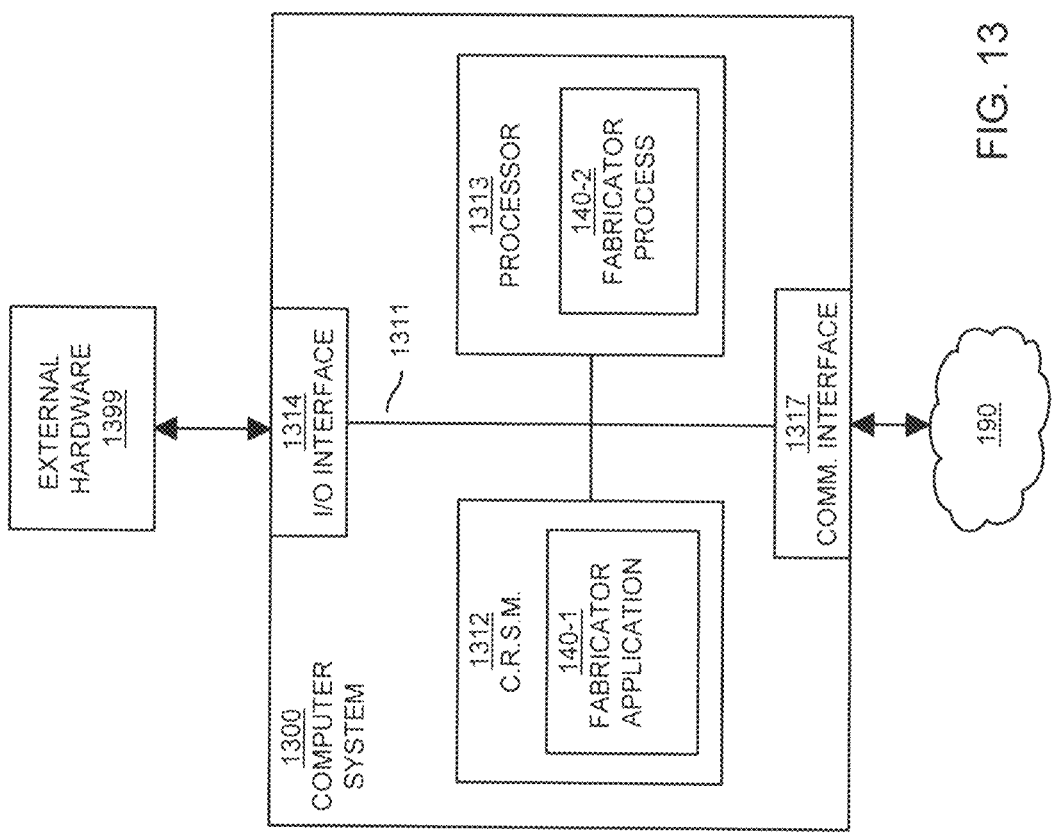
FIG. 13 is an example diagram illustrating example computer architecture (fabricator system, hardware, etc.) operable to execute one or more methods according to embodiments herein.

FIG. 13 is a diagram illustrating example computer architecture operable to execute one or more methods according to embodiments herein.

As previously discussed, any of the resources (such as fabricator 140, etc.) as discussed herein can be configured to include computer processor hardware and/or corresponding executable instructions to carry out the different operations as discussed herein.

As shown, computer system 1300 of the present example includes an interconnect 1311 that couples computer readable storage media 1312 such as a non-transitory type of media (which can be any suitable type of hardware storage medium in which digital information can be stored and retrieved), a processor 1313 (such as computer processor hardware of one or more processor devices), I/O interface 1314, and a communications interface 1317.

I/O interface(s) 1314 supports connectivity to external hardware 1399 (such as fabrication equipment) such as including a keyboard, display screen, repository, etc.

Computer readable storage medium 1312 can be any hardware storage device such as memory, optical storage, hard drive, floppy disk, etc. In one embodiment, the computer readable storage medium 1312 stores instructions and/or data.

As shown, computer readable storage media 1312 can be encoded with fabricator application 140-1 (e.g., including instructions) to carry out any of the operations as discussed herein.

During operation of one embodiment, processor 1313 accesses computer readable storage media 1312 via the use of interconnect 1311 in order to launch, run, execute, interpret or otherwise perform the instructions in fabricator application 140-1 stored on computer readable storage medium 1312. Execution of the fabricator application 140-1 produces fabricator process 140-2 to carry out any of the operations and/or processes as discussed herein.

Those skilled in the art will understand that the computer system 1300 can include other processes and/or software and hardware components, such as an operating system that controls allocation and use of hardware resources to execute fabricator application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1300 may reside at any location or can be included in any suitable resource in any network environment to implement functionality as discussed herein.

Figure 14:
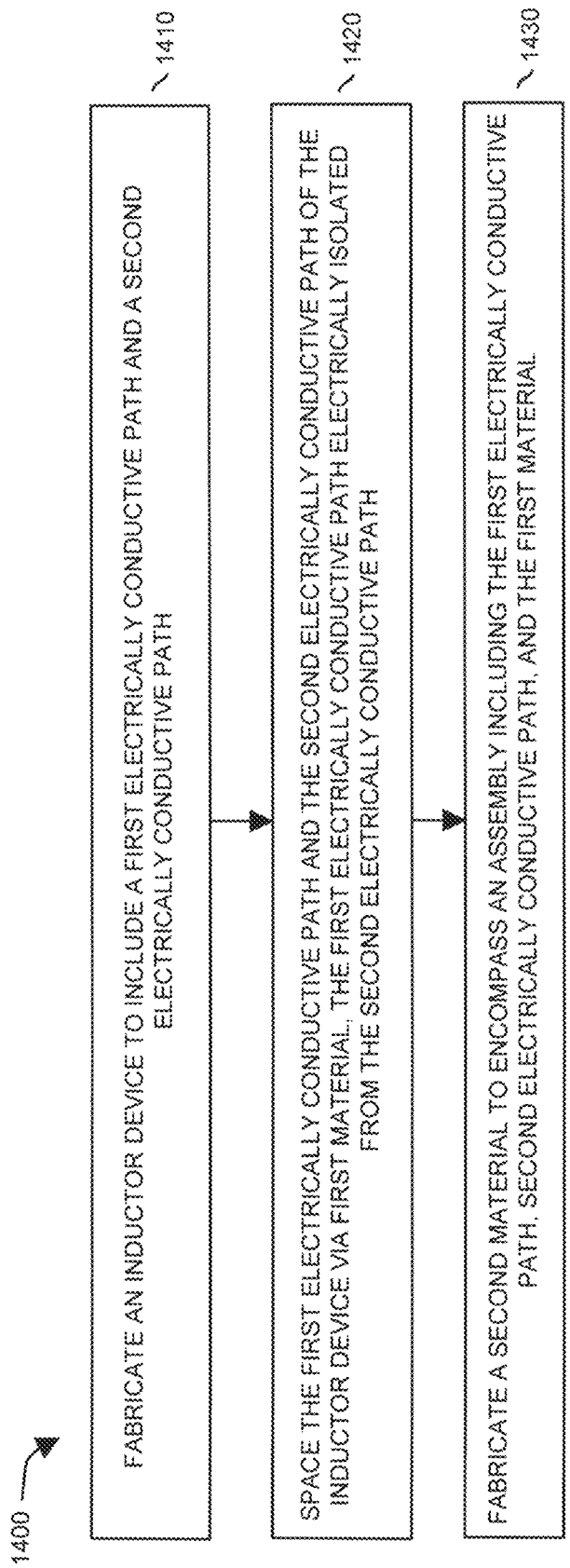
FIG. 14 is an example diagram illustrating a method according to embodiments herein.

Functionality supported by one or more resources as described herein are discussed via flowchart in FIG. 14. Note that the steps in the flowcharts below can be executed in any suitable order.

FIG. 14 is a flowchart 1400 illustrating an example method according to embodiments herein. Note that there will be some overlap with respect to concepts as discussed above.

In processing operation 1410, the fabricator 140 fabricates an inductor device 120 to include a first electrically conductive path 131 and a second electrically conductive path 132.

In processing operation 1420, via first material 141, the fabricator 140 spaces or isolates the first electrically conductive path 131 from the second electrically conductive path 132.

In processing operation 1430, the fabricator 140 fabricates a second material 142 to encompass an assembly including the first electrically conductive path 141, second electrically conductive path 142, and the first material 141.

FIG. 15 is an example diagram illustrating fabrication of a circuit board according to embodiments herein.

In this example embodiment, fabricator 1540: receives a substrate 1510 (such as a circuit board); affixes the power system 100 (such as a power supply and corresponding components) to the substrate 1510.

The fabricator 1540 further affixes the power converter 195 to the substrate 1510. Via circuit path 1521 (such as one or more traces, etc.), the fabricator 1540 couples the power system 100 to the power converter 195. Via circuit path 1522 (such as one or more traces, etc.), the fabricator 1540 couples the power converter 195 to a load 1518. In one embodiment, the circuit path 1521 conveys output voltage 123 generated from the power supply 100 to the power converter 195. Via components such as inductor device 120 and/or assembly 610, or 620, 0 or 630, the power converter 195 converts the received output voltage 123 into a target voltage that drives load 1518.

Accordingly, embodiments herein include a system comprising: a substrate 1510 (such as a circuit board, standalone board, mother board, standalone board destined to be coupled to a mother board, etc.); a power system 100 including a power converter 150 as described herein; and a load 1518, the load 118 being powered based on energy or power provided by an output voltage conveyed via circuit path 1522. For example, the power converter 195 converts an input voltage from power system 100 into a suitable secondary output voltage that powers load 1518. The load 1518 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1510.

Note again that techniques herein are well suited for use in fabrication of inductor devices. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An inductor device comprising:
a first electrically conductive path;
a second electrically conductive path, the first electrically conductive path disposed within the second electrically conductive path;
first material, the first material operative to space the first electrically conductive path with respect to the second electrically conductive path, the first material electrically isolating the second electrically conductive path from the first electrically conductive path in the inductor device;
second material, the second material being magnetically permeable material;
an assembly of the first electrically conductive path, the second electrically conductive path, and the first material being disposed in a core of the second material.

2. The inductor device as in claim 1, wherein the first electrically conductive path is a first tubular structure extending along an axial length of the inductor device from a first end of the inductor device to a second end of the inductor device; and
wherein the second electrically conductive path is a second tubular structure extending along the axial length of the inductor device from the first end to the second end.

3. The inductor device as in claim 2, wherein the first tubular structure resides in the second tubular structure.

4. The inductor device as in claim 3, wherein the first material provides concentric spacing of the second tubular structure with respect to the first tubular structure; and
wherein the second material is disposed as a layer of material external to the second tubular structure.

5. The inductor device as in claim 1, wherein the second material has a magnetic permeability greater than 1.

6. The inductor device as in claim 1, wherein current passing through the first electrically conductive path produces magnetic flux; and
wherein a first density of the magnetic flux in the first material is substantially less than a second density of the magnetic flux in the second material.

7. The inductor device as in claim 1 further comprising:
a third electrically conductive path encompassing the second material.

8. The inductor device as in claim 1, wherein the first electrically conductive path is a first tubular structure; and
wherein the second electrically conductive path is a second tubular structure disposed in the first tubular structure.

9. The inductor device as in claim 1, wherein the second electrically conductive path is tubular.

10. The inductor device as in claim 1, wherein the first electrically conductive path is tubular.

11. The inductor device as in claim 1, wherein the second electrically conductive path is magnetically coupled to the first electrically conductive path.

12. The inductor device as in claim 1, wherein the second electrically conductive path includes a core volume in which the first circuit path resides.

13. An inductor device comprising:
a first electrically conductive path;
a second electrically conductive path;
first material, the first material operative to space the first electrically conductive path with respect to the second electrically conductive path, the first material electrically isolating the second electrically conductive path from the first electrically conductive path in the inductor device; and
second material, the second material being magnetically permeable material, an assembly of the first electrically conductive path, second electrically conductive path, and the first material being disposed in a core of the second material;
wherein the first material has a first permeability;
wherein the second material has a second permeability, the second permeability greater than the first permeability, the inductor device further comprising:
third material, the third material encompassing an assembly of the first electrically conductive path, the second electrically conductive path, the first material, and the second material, the third material having a third permeability.

14. The inductor device as in claim 13, wherein the second material extends a first distance along an axial length of the inductor device; and wherein the third material extends a second distance along the axial length of the inductor device, the second distance being less than the first distance.

15. The inductor device as in claim 13, wherein the third permeability is substantially greater than the second permeability.

16. An inductor device comprising:
a first electrically conductive path;
a second electrically conductive path;
first material, the first material operative to space the first electrically conductive path with respect to the second electrically conductive path, the first material electrically isolating the second electrically conductive path from the first electrically conductive path in the inductor device; and
second material, the second material being magnetically permeable material, an assembly of the first electrically conductive path, second electrically conductive path, and the first material being disposed in a core of the second material;
wherein the first electrically conductive path is a first portion of a split tubular structure extending along an axial length of the inductor device; and
wherein the second electrically conductive path is a second portion of the split tubular structure extending along the axial length of the inductor device.

17. The inductor device as in claim 16, wherein the first material resides in a volume between a cavity of the first portion of the split tubular structure and a cavity of the second portion of the split tubular structure; and
wherein current through the first electrically conductive path produces magnetic flux, a density of the magnetic flux in the first material being substantially less than a density of the magnetic flux in the second material.

18. The inductor device as in claim 16, wherein the split tubular structure is a first tubular structure, the inductor device further comprising:
a third electrically conductive path, the third electrically conductive path being a second tubular structure extending along the axial length of the inductor device.

19. The inductor device as in claim 18, wherein the third electrically conductive path resides in between the first electrically conductive path and the second electrically conductive path.

20. A method comprising:
fabricating an inductor device to include a first electrically conductive path and a second electrically conductive path;
spacing the first electrically conductive path and the second electrically conductive path of the inductor device via first material, the first electrically conductive path fabricated to reside within the second electrically conductive path, the spacing isolating the first electrically conductive path from the second electrically conductive path; and
encompassing, via a layer of second material, an assembly including the first electrically conductive path, the second electrically conductive path, and the first material with a layer of second material, the second material being magnetically permeable.

21. The method as in claim 20 further comprising:
fabricating the first electrically conductive path as a first tubular structure extending along an axial length of the inductor device from a first end of the inductor device to a second end of the inductor device; and
fabricating the second electrically conductive path as a second tubular structure extending along the axial length of the inductor device from the first end to the second end.

22. The method as in claim 21 further comprising:
disposing the first tubular structure inside the second tubular structure, the first material concentrically spacing the second tubular structure with respect to the first tubular structure.

23. The method as in claim 22 further comprising:
disposing the second material to be external to the second tubular structure.

24. The method as in claim 20, wherein the first material has a substantially lower permeability than the second material.

25. The method as in claim 20, wherein the second material has a magnetic permeability greater than 1.

26. The method as in claim 20, wherein the second material has a first magnetic permeability, the method further comprising:
disposing a layer of third material over the second material, the second material having a second magnetic permeability.

27. The method as in claim 26, wherein the second magnetic permeability is greater than the first magnetic permeability.

28. The method as in claim 26 further comprising:
disposing the second material to extend for a first distance along an axial length of the inductor device; and
disposing the third material to extend for a second distance along the axial length of the inductor device, the second distance being less than the first distance.

29. The method as in claim 20 further comprising:
fabricating the inductor device to include a third electrically conductive path, the third electrically conductive path encompassing an assembly including the first electrically conductive path, the second electrically conductive path, the first material, and the second material.

30. The method as in claim 20 further comprising:
designing a geometry of the first material to control a parasitic inductance and capacitance between the first electrically conductive path and the second electrically conductive path.

31. The method as in claim 20 further comprising:
designing a geometry of the second material to control a magnetizing inductance of the inductor device.

32. A method comprising:
fabricating an inductor device to include a first electrically conductive path and a second electrically conductive path;
spacing the first electrically conductive path and the second electrically conductive path of the inductor device via first material, the first electrically conductive path fabricated to reside within the second electrically conductive path, the spacing isolating the first electrically conductive path from the second electrically conductive path; and
encompassing, via a layer of second material, an assembly including the first electrically conductive path, the second electrically conductive path, and the first material with the layer of second material, the second material being magnetically permeable;
wherein the first electrically conductive path is a first portion of a split tubular structure extending along an axial length of the inductor device; and wherein the second electrically conductive path is a second portion of the split tubular structure extending along the axial length of the inductor device.

33. The method as in claim 32, wherein the first material resides in a volume between a cavity of the first portion of the split tubular structure and a cavity of the second portion of the split tubular structure; and
wherein the first material has a substantially lower magnetic permeability than the second material.

34. The method as in claim 32, wherein the tubular structure is a first tubular structure, the method further comprising:
fabricating the inductor device to include a third electrically conductive path, the third electrically conductive path being a second tubular structure extending along the axial length of the inductor device from the first end to the second end.

35. A method comprising:
receiving a circuit assembly;
fabricating the inductor device of claim 1 into the circuit assembly.

36. A system comprising:
a circuit board;
the inductor device of claim 1, the inductor device disposed in a circuit affixed to the circuit board.

37. An assembly comprising:
a first inductor device fabricated in accordance with the inductor device of claim 1;
a second inductor device fabricated in accordance with the inductor device of claim 1; and
the first device and the second device being connected in series.

38. An assembly comprising:
a first inductor component fabricated in accordance with the inductor device of claim 1;
a second inductor component fabricated in accordance with the inductor device of claim 1; and
the first inductor component and the second inductor component being connected in parallel.

39. An inductor device comprising:
a first electrically conductive path;
a second electrically conductive path, the first electrically conductive path disposed within the second electrically conductive path;
first material, the first material operative to space the second electrically conductive path with respect to the first electrically conductive path, the first material electrically isolating the second electrically conductive path from the first electrically conductive path in the inductor device, the first material enveloping the first electrically conductive path, the first material disposed within the second electrically conductive path;
second material, the second material being magnetically permeable material; and
wherein an assembly of the first electrically conductive path, the second electrically conductive path, and the first material being disposed in a core of the second material.

40. The inductor device of claim 39, wherein the second material envelops the second electrically conductive path.

41. The inductor device of claim 40 further comprising:
a third electrically conductive path, the third electrically conductive path enveloping the second material.

42. The inductor device as in claim 39, wherein the second electrically conductive path is magnetically coupled to the first electrically conductive path.

* * * * *